United States Patent
Voutsas et al.

(10) Patent No.: US 6,809,801 B2
(45) Date of Patent: Oct. 26, 2004

(54) 1:1 PROJECTION SYSTEM AND METHOD FOR LASER IRRADIATING SEMICONDUCTOR FILMS

(75) Inventors: Apostolos Voutsas, Vancouver, WA (US); John W. Hartzell, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 64 days.

(21) Appl. No.: 10/095,987

(22) Filed: Mar. 11, 2002

(65) Prior Publication Data

US 2003/0171007 A1 Sep. 11, 2003

(51) Int. Cl.[7] .................... G03B 27/42; G03B 27/74; H01L 21/20
(52) U.S. Cl. .................... 355/69; 355/53; 355/70; 438/487
(58) Field of Search ............... 438/487, 779; 430/5, 30; 250/492.2; 117/43, 103, 200; 355/53, 67, 70, 77

(56) References Cited

U.S. PATENT DOCUMENTS

| | | | | |
|---|---|---|---|---|
| 4,309,225 A | * | 1/1982 | Fan et al. | 438/72 |
| 5,285,236 A | | 2/1994 | Jain | 355/53 |
| 5,710,619 A | | 1/1998 | Jain et al. | 355/50 |
| 5,923,403 A | | 7/1999 | Jain | 355/26 |
| 5,933,216 A | | 8/1999 | Dunn | 355/53 |
| 5,938,839 A | * | 8/1999 | Zhang | 117/104 |
| 6,210,484 B1 | * | 4/2001 | Hathaway | 118/724 |
| 6,268,906 B1 | | 7/2001 | Suzuki | 355/67 |
| 6,577,380 B1 | * | 6/2003 | Sposili et al. | 355/67 |
| 6,621,044 B2 | * | 9/2003 | Jain et al. | 219/121.7 |
| 6,680,242 B2 | * | 1/2004 | Ohtsu et al. | 438/487 |
| 2001/0001745 A1 | | 5/2001 | Im et al. | 438/747 |
| 2001/0041426 A1 | | 11/2001 | Im | 438/479 |
| 2002/0179589 A1 | * | 12/2002 | Morita et al. | 219/411 |
| 2003/0183612 A1 | * | 10/2003 | Timans et al. | 219/390 |

OTHER PUBLICATIONS

J.S. Im and H.J. Kim, Appl. Phys. Lett., 63, 1969 (1993).
R. Sposili and J.S. Im, Appl. Phys. Lett., 69, 2864 (1996).

* cited by examiner

Primary Examiner—Alan Mathews
(74) Attorney, Agent, or Firm—David C. Ripma; Matthew D. Rabdau; Joseph P. Curtin

(57) ABSTRACT

A 1:1 laser projection system and method are provided for laser irradiating a semiconductor film. The method comprises: exposing a mask to a beam of laser light; projecting laser light passed through the mask by a factor of one; exposing the area of a semiconductor film to the projected laser light having a first energy density; exposing an area of semiconductor film to a lamp light having a second energy density; and, summing the first and second energy densities to heat the area of film. When the semiconductor film is silicon, the film heating typically entails melting, and then, crystallizing the film. In some aspects of the method, the lamp is an excimer lamp having a wavelength of less than 550 nanometers (nm), and the laser is an excimer laser having a wavelength of less than 550 nm. In some aspects, the lamp is mounted to expose the bottom surface of the film including an area underlying the area being laser irradiated. Alternately, the lamp is mounted above the substrate with the laser optics system, to directly expose the top surface of the substrate to light.

11 Claims, 3 Drawing Sheets

1:1 PROJECTION SYSTEM AND METHOD FOR LASER IRRADIATING SEMICONDUCTOR FILMS

BACKGROUND OF THE INVENTION

1. Field of the Invention

This invention generally relates to liquid crystal display (LCD) and integrated circuit (IC) fabrication and, more particularly, to a silicon film and fabrication process to laser irradiate silicon film in making polycrystalline silicon thin film transistors (TFTs) for Active Matrix (AM) LCDs using a 1:1 laser projection mechanism.

2. Description of the Related Art

Lateral crystallization by excimer-laser anneal (LC-ELA) is a desirable method for forming high quality polycrystalline silicon films having large and uniform grains. Further, this process permits precise control of the grain boundary locations.

FIG. 1 illustrates steps in an LC-ELA annealing process (prior art). As seen in Step 1, initially amorphous silicon film is irradiated by a laser beam that is shaped by an appropriate mask to an array of narrow "beamlets". The shape of the beamlets can vary. In Steps 1–4, each beamlet is shaped as a straight slit of narrow width, approximately 3–5 microns ($\mu$m). This slit is represented in the figure as the two heavy lines. The width of the slit is the distance between these two lines. This width can vary, but ultimately it is dependent upon the attainable lateral growth length (LGL), which is defined as the distance crystals can grow laterally (inwardly) from the edges of the irradiated area. Typically, the beamlet width is designed to be slightly less than twice the corresponding LGL.

The sequence of steps in FIG. 1 illustrates the growth of long polysilicon grains by LC-ELA process. A step-and-repeat approach is used. The laser beamlet width (indicated by the 2 parallel, heavy black lines) irradiates the film and, then steps a distance (d), smaller than half of the lateral growth length (L), i.e. d<L/2. Using this step-and-repeat process, it is possible to continually grow crystal grains from the point of the initial irradiation, to the point where the irradiation steps cease. L is dependent upon a combination of film thickness and substrate temperature. For 50 nanometer-thick films at room temperature, L is approximately 1.2 microns ($\mu$m). Due to this slow beamlet advancement, at each step, grains are allowed to grow laterally from the crystal seeds of the polycrystalline silicon (poly-Si) material formed in the previous step.

FIG. 2 illustrates a plan view of a conventional mask (prior art). The initially amorphous silicon film is irradiated by a very narrow laser beamlet, with typical width of a few microns (i.e. 3–5 $\mu$m). Such small beamlets are formed by passing the original laser beam through such a mask, that has open spaces, and projecting the formed beamlets on the surface of the annealed Si-film.

FIG. 3 is partial cross-sectional view of FIG. 1 illustrating the surface topography of laser-irradiated domains prior art). After the completion of the lateral growth, the two crystal fronts meet at the center of the domain where they form a "boundary" between the two crystal regions developing from each opposing edge of the domain. As a result of the grain boundary formation, a "ridge" develops at the surface of the film at the boundary, corresponding to the planned congruence of the two crystal fronts. Since the substrate steps under the beam a distance of d, where d is less than L/2, the ridge is irradiated is a subsequent shot. This ridge remelts and locally planarizes. However, as part of the same process, another ridge is formed at a new location. Therefore, the ridge location will "march" across the substrate in response to the scans under the beam.

If the angle of rotation between the lattice mismatch on the two sides of the boundary is less than approximately 15 degrees, the boundary is considered to be a low-angle boundary. An angle of rotation between 15 and 90 degrees is considered to be a high-angle boundary. Electron mobility between high-angle boundaries is impaired, while mobility between low-angle boundaries is usually insignificant. The step-and-repeat annealing typically promotes low-angle boundaries. However, the film regions corresponding to the mask edges, not being subject to the step-and-repeat process, are likely to form high-angle boundaries.

When high-angle boundaries are formed, the TFT channels need to be arranged to avoid these regions. That is, the TFTs need to be formed in the planar regions between neighboring ridges to avoid performance deterioration. Even more undesirable is the formation of neighboring TFTs with different performance parameters, resulting from the random formation of TFT channels with ridges adjacent TFT channels without ridges. Hence, some sort of alignment is necessary between the crystallized domains and the position of the TFT channels within these domains. This alignment process introduces additional processing steps, hence, increasing the cost of the process. It would be desirable to eliminate these additional processing steps so that TFT channels can be placed on the processed (laterally crystallized) film without the requirement of calculating ridge alignments.

Typically the beam, after being shaped by a mask such as the one shown in FIG. 2, is projected on the surface of the sample after being "demagnified" by several times. As a result of this demagnification, the beam area shrinks considerably by comparison to the beam area available at the mask plane. One unfortunate result of a demagnified beamlet is an increase in the number of high-angle boundaries. Since the laser energy remains the same, while the beam area shrinks, the laser energy density on the surface of the substrate is much higher than on the mask. The typical demagnification factor is x3–x5, which means that the beam area on the substrate is 9 to 25 times smaller than on the mask. Consequently, the laser energy density on the mask is 9 to 25 times lower than on the substrate. This allows very low energy density levels on the mask for a given requirement of energy density on the substrate.

Generally, for low cost masks, it is important to avoid exposing the mask at high laser energy density levels. The demagnification of x3–x5 associated with the conventional use of masks minimizes the exposure of masks to high energy densities. For example, if a 1:1 projection were used with the masks, instead of 3:1 to 5:1, the amount of laser energy density impinging on the mask would necessitate frequent mask changes to maintain dimensional stability and to reduce optical artifacts. Even with frequent mask, it is doubtful that such a scheme would be practical in a mass production application. However, a 1:1 projection concept would have certain advantages. Larger areas of film can be exposed to each laser shot, so throughput would be increased. Likewise, control over the location of crystallized areas would be enhanced. Further, simple schemes would be available to reduce material directionality issues, as electrical performance is not isotropic, but depends upon the relative position of the device channel with respect to the lateral growth direction. Hence, it would be desirable to use a 1:1 projection laser irradiation, if a means could be found of reducing the possibility of mask damage.

It would be advantageous to develop a 1:1 laser projection system that did not increase the likelihood of damaging masks. To that end, it would be advantageous if a 1:1 projection system could be used with a lower power laser energy density.

It would be advantageous if additional energy could be directed to the substrate in a controlled manner to decrease the energy that must be directed to any particular area of the substrate through the mask.

It would be advantageous to increase the "footprint" of the laser beamlet on the substrate to increase process times and to reduce to formation of high-angle boundaries.

SUMMARY OF THE INVENTION

The present invention is a system and method that uses a lamp, in additional to the mask-projected laser beam, to anneal a semiconductor substrate. The use of the lamp as an auxiliary heat source permits a 1:1 projection lens to be used to distribute the a lower power laser light through the mask.

Accordingly, a 1:1 laser projection method is provided for laser irradiating a semiconductor film. The method comprises: exposing a mask to a beam of laser light; projecting laser light passed through the mask by a factor of one; exposing the area of a semiconductor film to the projected laser light having a first energy density; exposing an area of semiconductor film to a lamp light having a second energy density; and, summing the first and second energy densities to heat the area of film. When the semiconductor film is silicon, the film heating typically entails melting, and then, crystallizing the film.

In some aspects of the method, the lamp is an excimer lamp having a wavelength of less than 550 nanometers (nm), and the laser is an excimer laser having a wavelength of less than 550 nm. In some aspects of the method, the lamp is mounted to expose the bottom surface of the film including an area underlying the area being laser irradiated. Alternately, the lamp is mounted above the substrate, with the laser optics system, to directly expose the top surface of the substrate to light.

Additional details of the above-described method, and a 1:1 projection system for laser irradiation are presented in detail below.

DETAILED DESCRIPTION OF THE PREFERRED EMBODIMENTS

Figure 1:
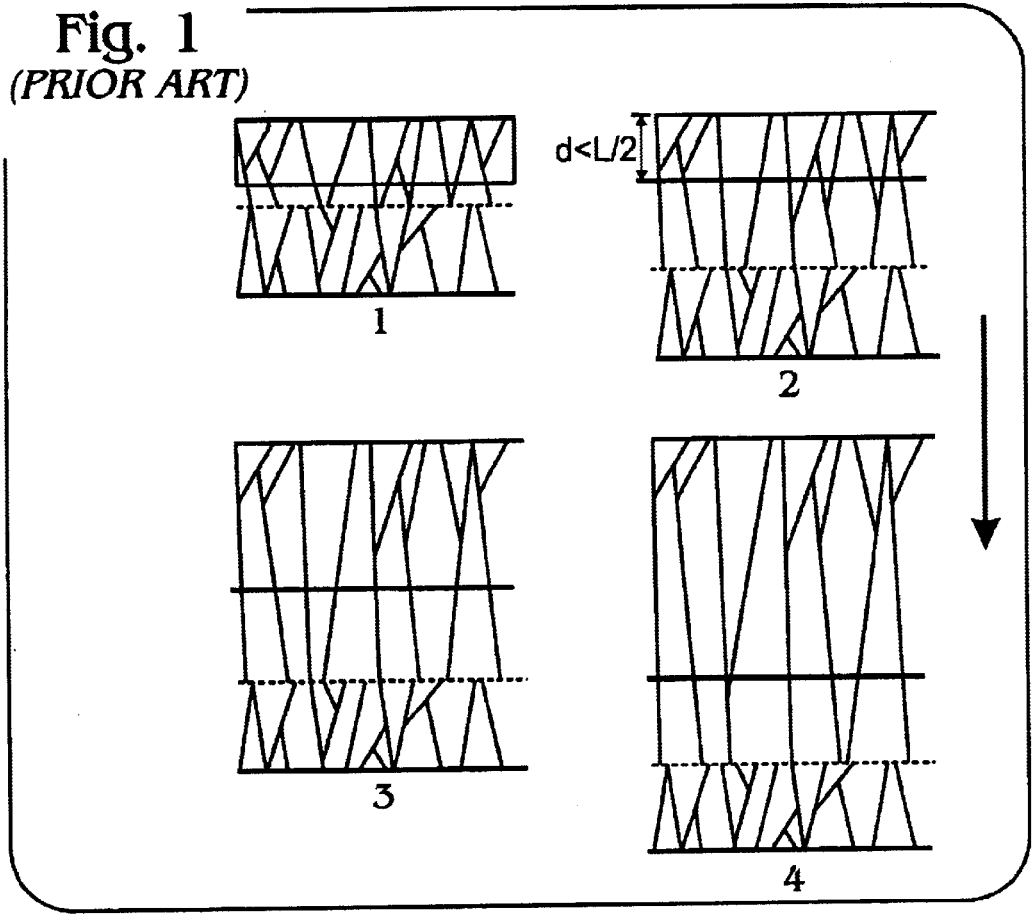
FIG. 1 illustrates steps in an LC-ELA annealing process (prior art).
Figure 2:
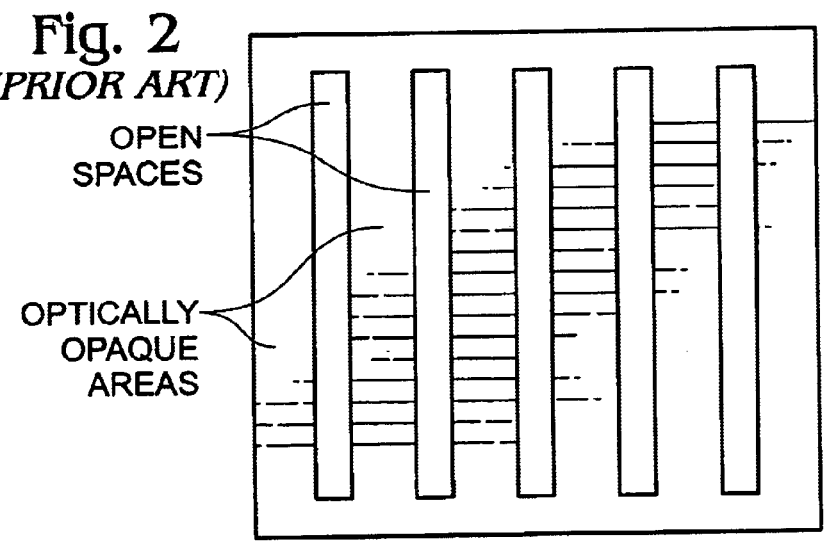
FIG. 2 illustrates a plan view of a conventional mask (prior art).
Figure 3:
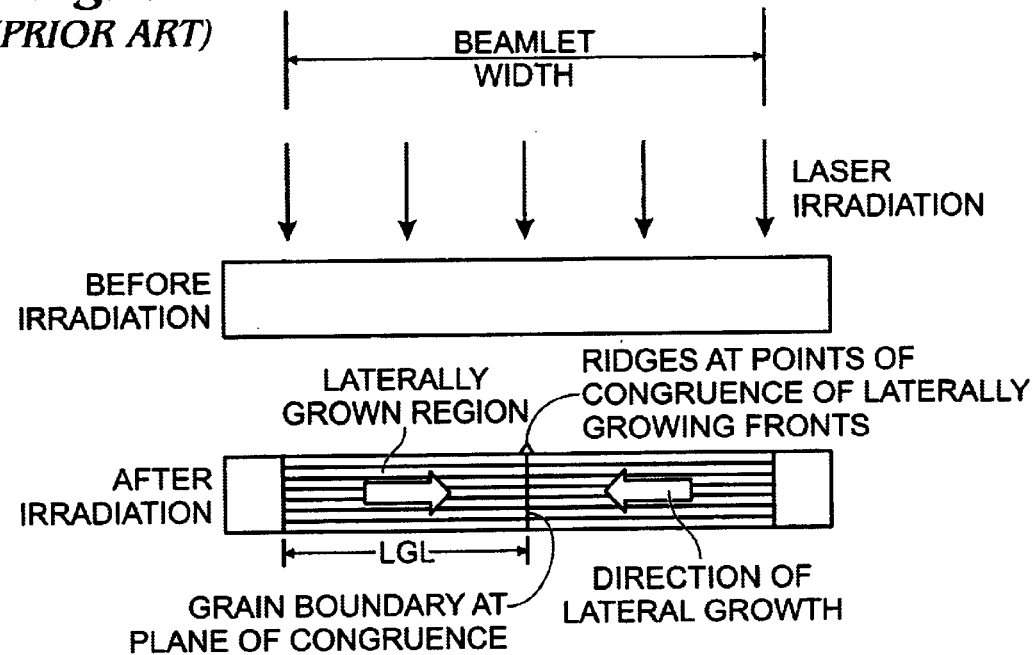
FIG. 3 is partial cross-sectional view of FIG. 1 illustrating the surface topography of laser-irradiated domains (prior art).
Figure 4:
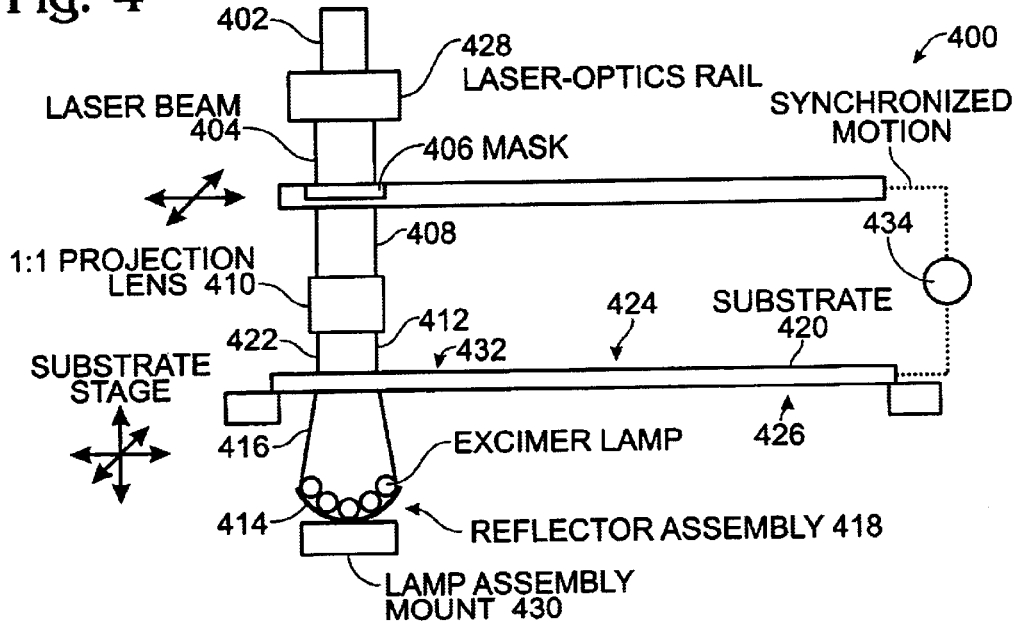
FIG. 4 is a diagram illustrating the present invention 1:1 laser projection system for laser irradiating a semiconductor film.

FIG. 4 is a diagram illustrating the present invention 1:1 laser projection system for laser irradiating a semiconductor film. The system 400 comprises a laser light source 402 to supply a laser light beam 404. A mask 406, such as the mask shown in FIG. 2, is exposed to the laser light beam 406 and selectively passes the laser light 408. As is well known in the art, there are a large variety of mask patterns available. A 1:1 projection lens 410 has an input to accept the laser light 408 passed by the mask 406 and an output to supply laser light 412 with a magnification factor of one as a first energy density source. In other aspects of the invention, the magnification factor is a factor in the range from 1 to 3. A lamp source 414 supplies lamp light 416 as a second energy density source. As shown, the lamp 414 can includes a plurality of lamps, of which lamp 417 is representative, and a focusing reflector 418.

A semiconductor film 420 has a first area 422 on surface 424 that is exposed to the first and second energy density sources. The first energy density and second energy density are summed in the film first area 422 to yield a third energy density. When the semiconductor film 420 is a silicon film, the first area of silicon film 422 is melted and crystallized in response to the third energy density.

In some aspects of the system 400, the lamp source 414 supplies light having a wavelength of less than 550 nanometers (nm). Likewise, the laser light source 402 supplies a laser light having a wavelength of less than 550 nm. In some aspects, the substrate 420 has a bottom surface 426 interfacing a glass substrate (not shown), such as might be used in the fabrication of an LCD. Then, it is likely that the light wavelength will be in the range between 350 and 550 nm, at least for the underlying lamp 414, as wavelengths below 350 nm are absorbed by glass. In some aspects of the system, the lamp source 414 is an excimer lamp source and the laser light source 402 is an excimer laser source.

As shown, the, projection lens 410 overlies the film top surface 424, supplying light to the first area 422 of a semiconductor film, and the lamp source 414 underlies the film bottom surface 426, supplying light to a bottom surface of the film 426 including an area underlying the first area 422. It should be understood that the lamp 414 supplies energy to supplement the energy from the laser light 412. As such, the lamp light 416 can be more indirect, such as being directed under the first area 422, or directed against an area of the substrate that is larger than the first area 422. It should also be understood that the lamp may provide an energy density to the bottom surface that exceeds the second density, as some energy is lost in transmission through the substrate 420 to the first area 422.

The system further comprises a rail 428 for stationary mounting of the laser light source 402 and projection lens 410. The system also comprises a mount 430 for stationary mounting of the lamp source 414. The mask 406 and substrate 420 are moveably mounted to a stage 434. Alternately stated, the stage 434 includes a mask stage and substrate stage that arc controlled to move synchronously. In one aspect of the system as shown, the stage 434 moves the mask 406 and substrate 420 to expose a second area of the film 432 adjacent the first area 422 to the first energy density (laser light source). The lamp source 414 supplies light 416 to the bottom surface of the film including an area underlying the second area 432. As noted above, the area exposed by the lamp may be larger than just the second area.

Alternately, the lamp source is mounted to a mount overlying the film top surface 424, directly supplying light to an area including the first area of the film 422. As explained above, the lamp light can be more irregularly and differently delivered to the first area 422. Therefore, the lamp can be mounted to the side of laser source 402 or even behind (above) the laser source 402 in some aspects of the system. As above, the stage moves the mask 406 and substrate 420 so that the second area 434 is exposed to the first energy density. That is, the laser light source 402 supplies light to an area including the second area of the film 432, when the laser light is projected upon the second area 432. The lamp source 414 supplied light to an area of the film top surface 424 including the second area 432.

FUNCTION DESCRIPTION OF THE SYSTEM

A laser beam is generated by laser equipment and is guided via mirrors and optical elements, that are represented by laser source 402, to the surface of the film to be annealed. Optical elements include beam attenuators, telescope lenses (used to shape the raw beam), homogenizers (used to homogenize the beam energy profile in 2-D), a field lens, a masking system and a projection lens. Other elements may also be included in the optical path, as necessary. The mask can move in x-y directions. The substrate also moves in x-y directions (as well as, optionally in z direction for minute focus adjustments). The substrate sits on a stage that is "open", in other words it consists of an open frame that supports the substrate only at the edges. The motion between the mask and the substrate are synchronized, in the sense that they both move simultaneously in the same direction and with the same velocity. The mask stage is also capable of minute adjustments relative to the substrate (in the order of 0.1 μm). A lamp assembly is located below the substrate stage level in one aspect of the invention. The lamp assembly may consist of a number of excimer lamps (5 shown) and a reflector assembly behind the lamps.

The total energy that reaches the surface of the film process consists of two components: (1) one component is the laser energy that directly irradiates the surface of the film through the 1:1 projection lens. (2) The second component is the energy that is absorbed from the excimer lamps that also irradiate the film at, or near the same location. The lamp(s) are shown at the bottom of the substrate in the embodiment of FIG. 4, however, it is also possible to irradiate the film with the excimer lamps from the top. By optimizing the ratio between the energy supplied by each source it is possible to: (1) Achieve locally a total energy that exceeds the threshold necessary for LC-ELA process, (2) Allow only sufficiently small amount of energy to pass through the mask, which is below the damage threshold of the mask material. In other words, the excimer lamp "floods" the area under the laser beam with energy, however, insufficient by itself to completely melt the film. The remaining energy, required for melting and lateral crystallization, is provided by the laser and is directed only on locations, which are precisely specified by the selected mask pattern.

Figure 5:
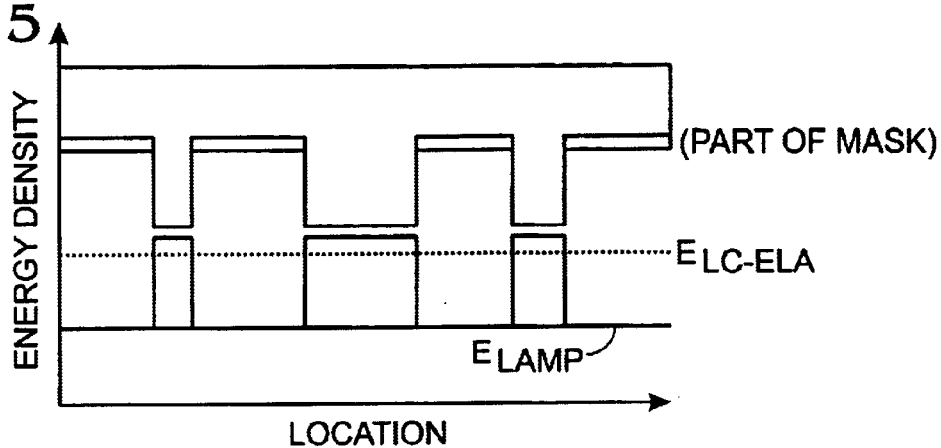
FIG. 5 is a graph illustrating the provisioning of the first and second energy densities by the laser light source and lamp source, respectively.

FIG. 5 is a graph illustrating the provisioning of the first and second energy densities by the laser light source and lamp source, respectively. The energy from the lamp ($E_{lamp}$) provides a basic energy threshold. Where the mask passes laser light, the combination of energies is greater than $E_{LC\text{-}ELA}$, permitting the silicon film to melt, and then crystallize.

Usage of the 1:1 projection concept has the added advantage that a larger area of film can be processed with each shot, as demagnification tends to significantly reduce the projected beam area. Throughput is improved, as larger areas are processed at each beam step, and fewer high-angle boundaries are formed.

Using the present invention system, a substrate can be annealed using a sequence such as the one described below:

Step 1: A mask is loaded in the mask stage;
Step 2: A substrate is loaded in the substrate stage;
Step 3: The substrate is pre-aligned to the mask using fiducial marks already patterned on the substrate. After the alignment process, the substrate and mask stages are both brought into a predetermined origin point (i.e., the top left corner of substrate).
Step 4: The lamps are turned on and focused on the broader area around the laser beam. The lamp power is preselected to the desired setting;
Step 5: The laser fires and the beam passes through the mask, is shaped, and irradiates the substrate only at locations predetermined by the mask pattern. The laser discharges in synchronization to the mask/substrate motion. Only after all motions are completed is the laser prompted to fire;
Step 6: At areas exposed to the laser beam, the combination of energy from the laser and the lamp causes lateral growth according to the mechanism of LC-ELA process. At areas where the laser beam is blocked, the substrate is heated insufficiently and no crystallization occurs;
Step 7: The laser pulse turns off, while the excimer lamp remains on;
Step 8: Mask and substrate stages move in synchronization to the next location to be exposed. The lamp assembly is positioned to expose the same location; In some aspects, the lamp light is distributed diffusely enough that the lamp need not move every time the mask and substrate moves;
Step 9: If not all of the substrate has been exposed; the process continues from Step 5;
Step 10: After all of the substrate has been exposed, the stage returns the mask and substrate to the origin. The mask micro-steps in relation to the substrate by a preselected step size (i.e. 0.5–3 μm) and at a preselected direction;
Step 11: New origin is defined for the mask stage based on its current location after micro-stepping;
Step 12: The process continues from step 5 for a new pass over the substrate, until desired number of passes is reached;
Step 13: All stages return to their home positions, the excimer lamp turns off, the substrate is unloaded, and a new substrate is loaded. The process restarts from step 2. If a new mask is also needed, then the process restarts from step 1.

Figure 6:
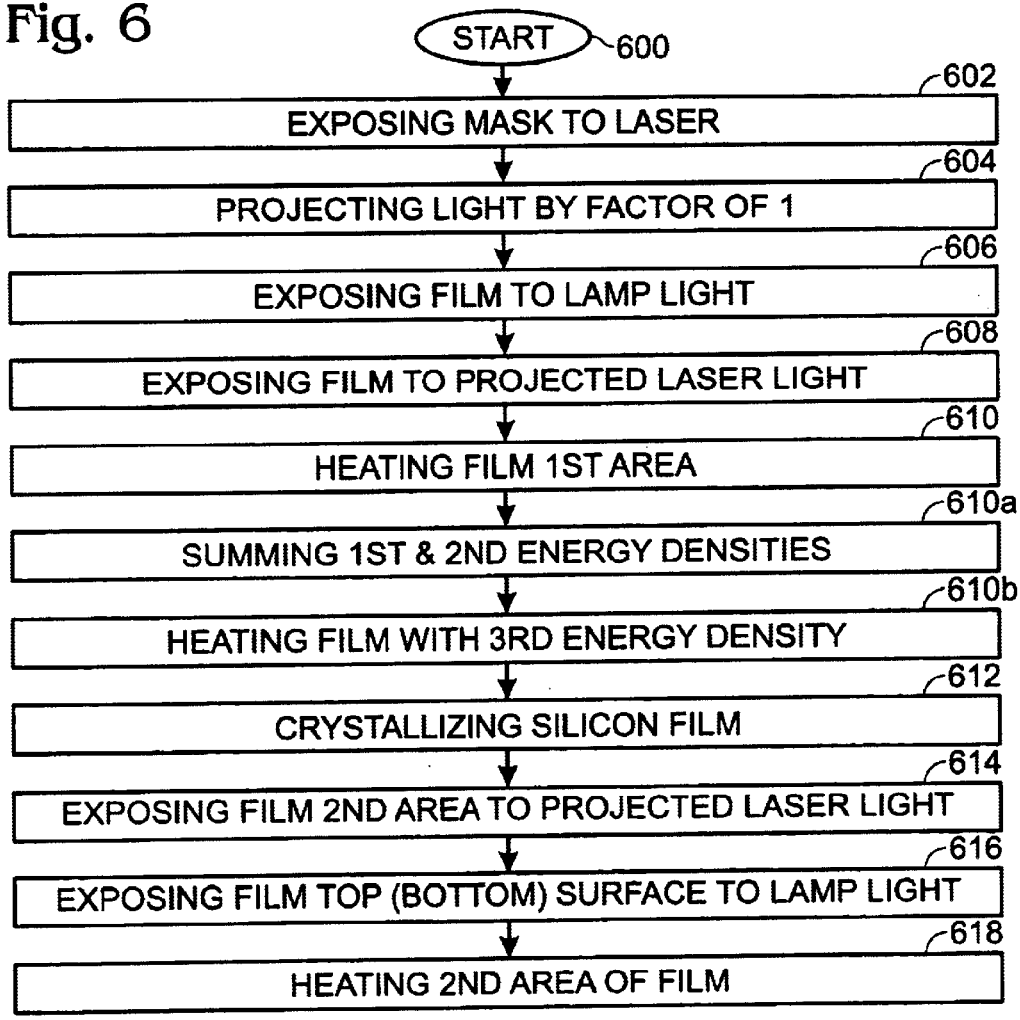
FIG. 6 is a flowchart illustrating the present invention 1:1 laser projection method for laser irradiating a semiconductor film.

FIG. 6 is a flowchart illustrating the present invention 1:1 laser projection method for laser irradiating a semiconductor film. This method generally corresponds to FIG. 4. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 600. Step 602 exposes a mask to a beam of laser light. Step 604 projects laser light (projected through the mask) by a factor of one. Step 606 exposes a first area of semiconductor film to a lamp light. Step 608 exposes the first area of a semiconductor film to the projected laser light. Step 610 heats the first area of film.

In some aspects of the method, exposing a first area of semiconductor film to a lamp light in Step 606 includes exposing the first area to a second energy density. Exposing the first area of a semiconductor film to the projected laser light in Step 608 includes exposing the first area to a first energy density. Then, heating the first area of film in Step 610 includes substeps. Step 610a sums the first energy density with the second energy density to yield a third energy density. Step 610b heats the first area of film in response to the third energy density.

In some aspects, the semiconductor film is a silicon film and heating the first area of film in response to the third energy density in Step 610b includes melting the first area of silicon film. Then, Step 612 crystallizes the first area of silicon film.

In other aspects, exposing a first area of semiconductor film to a lamp light in Step 606 includes exposing the first area to a light having a wavelength of less than 550 nanometers (nm), and exposing a mask to a beam of laser light in Step 608 includes exposing the mask to a laser light having a wavelength of less than 550 nm. In some aspects, exposing a first area of semiconductor film to a lamp light in Step 606 includes using an excimer lamp source to supply the light and exposing a mask to a beam of laser light in Step 608 includes using an excimer laser source to supply the beam of light.

In some aspects of the method, exposing the first area of a semiconductor film to the projected laser light in Step 608 includes exposing the first area on a top surface of the film. Exposing a first area of semiconductor film to a lamp light in Step 606 includes exposing a bottom surface of the film including an area underlying the first area. Then, Step 614, following the melting of the first area of the film (Step 610), exposes a second area of a semiconductor film, adjacent the first area, to the projected laser light. Step 616 exposes the bottom surface of the film including an area underlying the second area to the lamp light, and Step 618 heats the second area of the film.

Alternately, exposing a first area of semiconductor film to a lamp light in Step 606 includes exposing a top surface of the film including the first area. Then, Step 616 exposes a top surface of the film including the second area to the lamp light.

A method for laser irradiating a semiconductor film using a 1:1 projection system have been described. Some uses for the system have been given as examples. Likewise, some process specifics have been given to clearly explain the fundamental concepts. However, the invention is limited to merely these examples. Although a 1:1 projection system has been specifically described, the invention is applicable to low demagnification projection system, such as systems having a demagnification between 1 and 3. Other variations and embodiments of the invention will occur to those skilled in the art.

We claim:

1. A 1:1 laser projection method for laser irradiating a semiconductor film, the method comprising:

exposing a mask to a beam of laser light;
   projecting laser light, through the mask, by a factor of one;
   exposing a bottom surface underlying a first area of semiconductor film to a second energy density of excimer lamp light;
   exposing a first area top surface of the semiconductor film to a first energy density of the projected laser light; and,
   heating the first area of film by;
      summing the first energy density with the second energy density to yield a third energy density; and,
      heating the first area of film in response to the third energy density.

2. The method of claim 1 in which the semiconductor film is a silicon film;

wherein heating the first area of film in response to the third energy density includes melting the first area of silicon film; and,
   the method further comprising:
   crystallizing the first area of silicon film.

3. The method of claim 2 wherein exposing a first area of semiconductor film to a lamp light includes exposing the first area to a light having a wavelength of less than 550 nanometers (nm); and,
   wherein exposing a mask to a beam of laser light includes exposing the mask to a laser light having a wavelength of less than 550 nm.

4. The method of claim 3 wherein exposing a mask to a beam of laser light includes using an excimer laser source to supply the beam of light.

5. The method of claim 2 further comprising:
   following the melting of the first area of the film, exposing a second area of a semiconductor film, adjacent the first area, to the projected laser light;
   exposing the bottom surface of the film including an area underlying the second area to the lamp light; and
   heating the second area of the film.

6. A 1:1 laser projection system for laser irradiating a semiconductor film, the system comprising:
   a semiconductor film having a first area with a top surface and a bottom surface;
   a laser light source to supply a laser light beam;
   a mask exposed to the laser light beam and selectively passing the laser light;
   a 1:1 projection lens overlying the semiconductor film top surface having an input to accept the laser light passed by the mask and an output to supply laser light with a magnification factor of one as a first energy density source;
   an excimer lamp source underlying the semiconductor film bottom surface to supply lamp light as a second energy density source,
   wherein the semiconductor film first area is exposed to the first and second energy density sources that are summed to yield a third energy density.

7. The system of claim 6 wherein the semiconductor film is a silicon film, wherein the first area of silicon film is melted and crystallized in response to the third energy density.

8. The system of claim 6 wherein the lamp source supplies light having a wavelength of less than 550 nanometers (nm); and,
   wherein the laser light source supplies a laser light having a wavelength of less than 550 nm.

9. The system of claim 8 wherein the laser light source is an excimer laser source.

10. The system of claim 6 further comprising:
    a rail for stationary mounting of the laser light source and projection lens;
    a mount for stationary mounting of the lamp source;
    a stage to moveably mount the film and mask;
    wherein mask and substrate are moved by the stage to expose a second area of the film adjacent the first area, to the first energy density; and,
    wherein the lamp source supplies light to the bottom surface of the film including an area underlying the second area.

11. The system of claim 6 wherein the lamp includes a plurality of lamps and a focusing reflector.

* * * * *